United States Patent
Zhou et al.

(10) Patent No.: US 8,994,462 B2
(45) Date of Patent: Mar. 31, 2015

(54) CIRCUIT AND METHOD OF FREQUENCY JITTER, AND APPLICATION THEREOF IN SWITCHED-MODE POWER SUPPLY (SMPS)

(75) Inventors: Weijiang Zhou, Hangzhou (CN); Yunlong Yao, Hangzhou (CN)

(73) Assignee: Hangzhou Silan Microelectronics Co., Ltd., Hangzhou (CN)

( * ) Notice: Subject to any disclaimer, the term of this patent is extended or adjusted under 35 U.S.C. 154(b) by 368 days.

(21) Appl. No.: 13/387,466

(22) PCT Filed: Aug. 19, 2010

(86) PCT No.: PCT/CN2010/076127
§ 371 (c)(1),
(2), (4) Date: Mar. 7, 2012

(87) PCT Pub. No.: WO2011/020436
PCT Pub. Date: Feb. 24, 2011

(65) Prior Publication Data
US 2012/0163042 A1     Jun. 28, 2012

(30) Foreign Application Priority Data

Aug. 20, 2009 (CN) .......................... 2009 1 0102136

(51) Int. Cl.
*H03B 1/00* (2006.01)
*G06F 1/04* (2006.01)
(Continued)

(52) U.S. Cl.
CPC . *H02M 1/44* (2013.01); *G06F 1/10* (2013.01); *H03K 3/84* (2013.01); *H03K 7/06* (2013.01); *H04B 15/04* (2013.01); *H04B 2215/067* (2013.01)
USPC ............. 331/74; 331/57; 363/21.17; 327/291

(58) Field of Classification Search
CPC ........................................................ G06F 1/10
USPC ..................... 331/57, 74; 363/21.17; 327/291
See application file for complete search history.

(56) References Cited

U.S. PATENT DOCUMENTS 6,388,493 B2 *  5/2002  Saeki ............................ 327/299
7,177,166 B1    2/2007  Kris
(Continued)

FOREIGN PATENT DOCUMENTS

| CN | 101116239 A | 1/2008 |
| CN | 101262170 A | 9/2008 |
| CN | 101635504 A | 1/2010 |

OTHER PUBLICATIONS

Deng Fuhua et al., Research on Switching Frequency Jitter to the EMI Supression of DC/DC Convert, Electrotechnical Application, Feb. 19, 2007, vol. 26, No. 2, pp. 69-71, ISSN 1672-9560.

*Primary Examiner* — Arnold Kinkead
(74) *Attorney, Agent, or Firm* — Birch, Stewart, Kolasch & Birch, LLP (57) ABSTRACT

The present invention is to provide a frequency jitter circuit and a method for generating frequency jitter. The frequency jitter circuit, comprising: an oscillating circuit, configured to generate an oscillating frequency output signal; a decoding circuit, configured to be controlled by said oscillating frequency output signal for generating several pulse output signals; a delay circuit, through which said oscillating frequency output signal is passed for generating a frequency jitter output signal that is delayed a period of time compared to said oscillating frequency output signal. Application of the invention into switched-mode power supply might reduce EMI average noise in the switched-mode power supply, and smooth energy spectrum density.

15 Claims, 4 Drawing Sheets

(51) Int. Cl.
*H02M 1/44* (2007.01)
*G06F 1/10* (2006.01)
*H03K 3/84* (2006.01)
*H03K 7/06* (2006.01)
*H04B 15/04* (2006.01)

(56) References Cited

U.S. PATENT DOCUMENTS

2008/0024235 A1\* 1/2008 Chia ............................. 331/78
2009/0189666 A1 7/2009 Ichiyama et al.

\* cited by examiner

CIRCUIT AND METHOD OF FREQUENCY JITTER, AND APPLICATION THEREOF IN SWITCHED-MODE POWER SUPPLY (SMPS)

FIELD OF THE INVENTION

The present invention generally relates to switched-mode power supplies, and more particularly, the invention relates to frequency jitter technique used in integrated circuits.

BACKGROUND

Electro magnetic interference (EMI) generated by high frequency switch in switched-mode power supply (SMPS) voltage regulator circuit can be transmitted through AC power line in conduction or radiation manner, which effects normal working of peripheral equipments such as communication tools, household appliances, and auto control devices, etc.

For EMI control, radiation energy control standard is formulated to ensure no impact on normal working due to inter-interference among various equipments. In practice, EMI filter is often used to reduce the EMI, however, apparatuses such as external capacitor and inductor are needed which increases size and cost of PCB.

SUMMARY

The principle object of the present invention is to provide a frequency jitter circuit to delay oscillating frequency output from an oscillating circuit.

It is another object of the present invention to provide a method for generating frequency jitter.

The present invention further provides a switched-mode power supply (SMPS) with frequency jitter circuit.

The present invention further provides a method for SMPS modulation.

A frequency jitter circuit, comprising: an oscillating circuit, configured to generate an oscillating frequency output signal; a decoding circuit, configured to be controlled by said oscillating frequency output signal for generating several pulse output signals; a delay circuit, through which said oscillating frequency output signal is passed for generating a frequency jitter output signal that is delayed a period of time compared to said oscillating frequency output signal. Said pulse output signal controls delay time of the frequency jitter output signal.

Wherein, said oscillating circuit comprises a differential switch, a first capacitor, a first hysteresis comparator and a first current source; said differential switch is connected to said first current source; said first hysteresis comparator compares ramp voltage output from said first capacitor with charge/discharge reference voltage and output oscillating frequency output signal according to comparison results; the oscillating frequency output signal is fed back to the differential switch that controls charging and discharging of said first capacitor.

Said differential switch comprises a first PMOS, a second PMOS, a first NMOS, a second NMOS and a first inverter. Source of said first PMOS and source of second PMOS are connected to the first current source; drain of the first PMOS is connected to drain of the first NMOS; drain of the second PMOS is connected to drain of the second NMOS; drain of the first NMOS is connected to gates of the first NMOS and the second NMOS; source of the first NMOS and source of second NMOS are connected to ground; drain and source of the second NMOS are connected to two ends of the first capacitor, respectively; input of the first hysteresis comparator is connected to the first capacitor; the first hysteresis comparator outputs oscillating frequency output signal which is fed back to the gate of the second PMOS and the oscillating frequency output signal is fed back to the gate of the first PMOS after inversion by the first inverter.

Said decoding circuit comprises a frequency divider which divides the oscillating frequency output signal output from said oscillating circuit, to generate a pulse output signal.

If there are a plurality of said frequency dividers, these dividers are serially connected and following frequency divider divides output from preceding frequency divider. Then, outputs of the plurality of frequency dividers are combined by a logic circuit to generate several pulse output signals.

If there is only one said frequency divider, the frequency divider generates pulse output signal.

Said decoding circuit might be a counter that outputs one or more pulse output signals.

Said delay circuit comprises charge and discharge regulating circuits, a second current source, a third current source, a third PMOS, a third NMOS, a second inverter and a second hysteresis comparator. The number of said charge and discharge regulating circuits is identical to number of the pulse output signals; the oscillating frequency output signal output by said oscillating circuit is connected to gates of the third PMOS and the third NMOS after inversion by the second inverter; the third PMOS is connected to VDD directly or via the first current source; the third NMOS is connected to GND directly or via the third current source; and at least one of the second current source or the third current source must exist. Each pulse output of said decoding circuit controls one charge and discharge regulating circuit for charging or discharging individually; ramp pulse output of each charge and discharge regulating circuit is connected to drains of the third PMOS and the third NMOS, ramp pulses output from each charge and discharge regulating circuit are superimposed and then input to the second hysteresis comparator to see if it reaches an inverting voltage and to output the frequency jitter output signal.

Said charge and discharge regulating circuit comprises a fourth NMOS, a fifth NMOS, a second capacitor and a third inverter. The pulse output signal of said decoding circuit is input to gate of the fourth NMOS, and the pulse output signal is input to gate of the fifth NMOS via the inverter. The drain and source of the fourth NMOS are connected to two ends of the capacitor; source of the fourth NMOS is connected to GND; source of the fifth NMOS is connected to drain of the fourth NMOS, and ramp pulses are output by drain of the fifth NMOS.

Delay time of said delay circuit can be generated in other manners, e.g., controlling regulating current by several pulse output signals to charge/discharge to a fixed capacitor; or controlling regulating current and capacity by several pulse output signals; or controlling counting of high-frequency oscillator by several pulse output signals; or controlling a multi-stage delay circuit by several pulse output signals.

A method of generating frequency jitters, comprising: (1) generating oscillating frequency output signal; (2) decoding the oscillating frequency output signal to generate several pulse output signals; (3) delaying said oscillating frequency output signal to generate frequency jitter output signal, the frequency jitter output signal is delayed compared with the oscillating frequency output signal, and said pulse output signals controls delay time of said frequency jitter output signal.

Step (1) comprising: said oscillating frequency output signal is fed back to differential switch that controls charging and discharging of a first capacitor; when the oscillating frequency output signal reaches a first level, the first capacitor is charged by a first current source; when ramp voltage of the first capacitor reaches a discharging reference voltage, the oscillating frequency output signal is inverted and the first capacitor discharges; when the ramp voltage of the first capacitor reaches a charging reference voltage, the oscillating frequency output signal is inverted again to get a oscillating frequency output signal with oscillating period T.

Step (2) comprising: said pulse output signals are generated by dividing oscillating frequency output signal by a frequency divider.

There can be a plurality of frequency dividers, which are serially connected and following frequency divider divides output from preceding frequency divider. Then, outputs of the plurality of frequency dividers are combined by a logic circuit to generate several pulse output signals.

There can also be one frequency divider, which generates pulse output signal.

Said step (2) can also be implemented by a counter that outputs one or more pulse output signals.

Step (3) comprising: when oscillating frequency output signal is in first level, the pulse output signal controls discharging of corresponding second capacitor, and when superimposed ramp voltage of each second capacitor controlled by the pulse output signal reaches the discharge reference voltage, the frequency jitter output signal is in first level; and compared to the oscillating frequency output signal, time of said first level is delayed a period of time, the delay time is determined by quantity and capacity of discharge capacitors; when oscillating frequency output signal is in second level, the pulse output signal controls charging of corresponding second capacitor, and when the superimposed ramp voltage of each second capacitor controlled by the pulse output signal reaches the charge reference voltage, the frequency jitter output signal is in second level; and compared to the oscillating frequency output signal, time of said second level is delayed a period of time, the delay time is determined by quantity and capacity of charge capacitors.

A switched-mode power supply (SMPS) implemented by using frequency jitter circuit of the present invention comprises: a transformer, one terminal of primary coil of the transformer is connected to DC voltage input; one terminal of secondary coil of the transformer is connected to a diode, wherein, the other terminal of the diode is connected to positive end of DC voltage output; the other terminal of the secondary coil is connected to negative end of the DC voltage output; a power switch, the first terminal of the power switch is connected to the other terminal of said transformer's primary coil; the second terminal is connected to ground, and the third terminal is connected to a switch regulating circuit; a switch regulating circuit, said frequency jitter output signal and feedback signal of output of said transformer control the switch regulating circuit for switch signal regulation; said frequency jitter signal regulates frequency of the switch signal, said feedback signal regulates duty ratio of switch signal.

Said frequency jitter circuit, comprising: an oscillating circuit, configured to generate an oscillating frequency output signal; a decoding circuit, configured to be controlled by said oscillating frequency output signal to generate several pulse output signals; a delay circuit, through which said oscillating frequency output signal is passed to generate the frequency jitter output signal which is delayed a period of time compared to said oscillating frequency output signal; said pulse output signal controls delay time of frequency jitter output signal.

A method for regulating SMPS, comprising: (1) generating oscillating frequency output signal; (2) decoding the oscillating frequency output signal to generate several pulse output signals; (3) delaying said oscillating frequency output signal to generate frequency jitter output signal and said frequency jitter output signal controls delay time of said frequency jitter output signal; (4) controlling, by the frequency jitter output signal, the switch regulating circuit to adjust the output of power switch connected to transformer's primary coil.

The switch frequency obtained using the circuit and method of frequency jitter provided in the present invention is in a wide frequency range, which makes the EMI energy measured by EMI equipments spread over the bandwidth, and hopping of switch frequency reduces average EMI noise, which reduces the cost compared to the frequency hopping implemented by conventional filtering method.

DETAILED DESCRIPTION

The invention will be further described with reference to the accompanying drawings.

Figure 1:
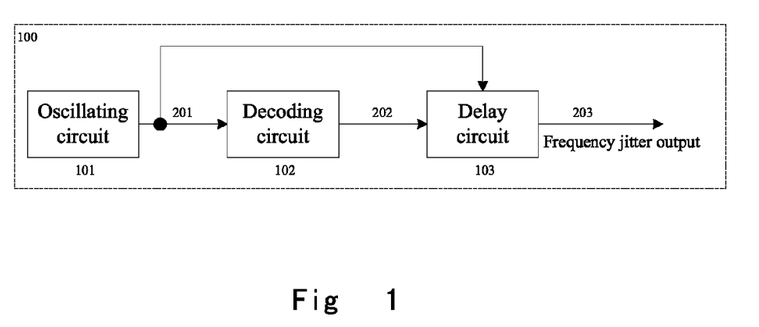
FIG. 1 is a block diagram of frequency jitter circuit of the invention.

FIG. 1 illustrates a frequency jitter circuit 100 of the invention, comprising:

an oscillating circuit 101, configured to generate an oscillating frequency output signal 201;

a decoding circuit 102, configured to be controlled by said oscillating frequency output signal 201 for generating several pulse output signals 202; in the preferred embodiment, three pulse output signals are explained as an example;

a delay circuit 103, through which said oscillating frequency output signal 201 is passed for generating the frequency jitter output signal 203 which is delayed a period of time compared to said oscillating frequency output signal 201. Said pulse output signal 202 controls delay time of frequency jitter output signal 203.

Figure 3:
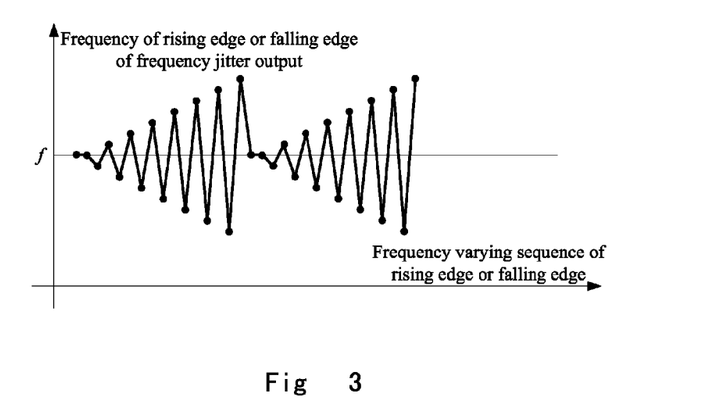
FIG. 3 is the frequency varying figure of the frequency jitter output signal of the invention.

FIG. 3 illustrates frequency varying of frequency jitter output signal in the present embodiment.

Figure 2:
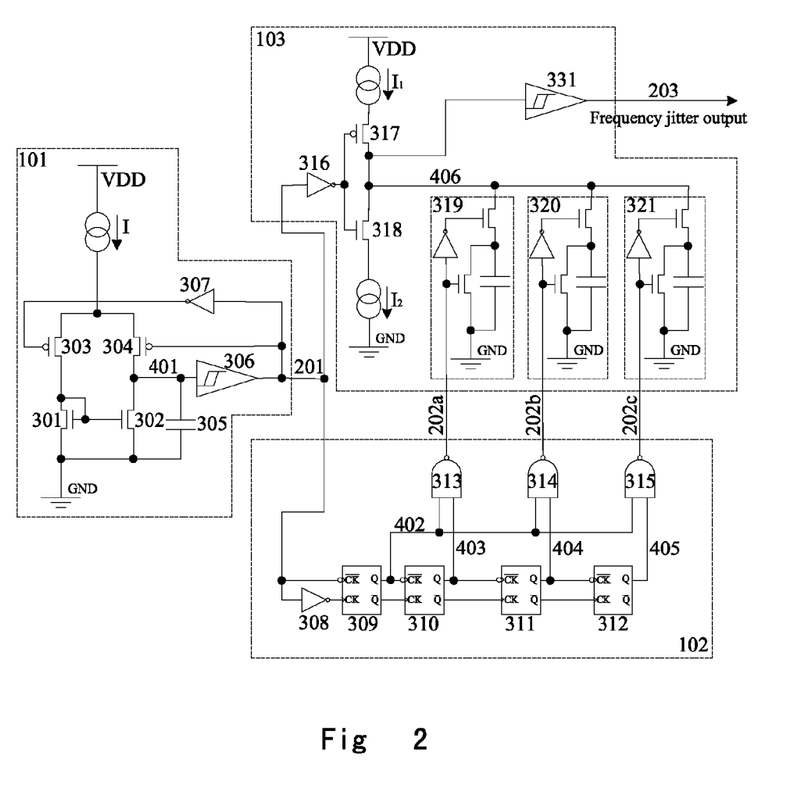
FIG. 2 is a representation of frequency jitter circuit of the invention.

As illustrated by FIG. 2, the oscillating circuit 101 might comprise a differential switch, a first capacitor 305, a first hysteresis comparator 306 and a first current source, said differential switch is connected to said first current source; said first hysteresis comparator 306 compares ramp voltage 401 from said first capacitor with the charge reference voltage or discharge reference voltage and the first hysteresis comparator 306 outputs oscillating frequency output signal 201 according to comparison results. The oscillating frequency output signal 201 is fed back to the differential switch that controls the charging and discharging of said first capacitor 305.

Said differential switch comprises a first PMOS 303, a second PMOS 304, a first NMOS 301, a second NMOS 302 and a first inverter 307. The source of said first PMOS 303 and the source of second PMOS 304 are connected to the first current source; the drain of the first PMOS 303 is connected to drain of the first NMOS 301; the drain of the second PMOS 304 is connected to drain of the second NMOS 302; the drain of the first NMOS 301 is connected to the gate of the first NMOS 301 and second NMOS 302; the source of the first NMOS 301 and the source of second NMOS 302 are connected to ground; the drain and source of the second NMOS 302 are connected to two ends of the first capacitor, respectively; the input of the first hysteresis comparator 306 is connected to the first capacitor. The first hysteresis comparator 306 outputs oscillating frequency output signal 201 which is fed back to the gate of the second PMOS 304 and to the gate of the first PMOS 303 after inversion by the first inverter 307.

Said decoding circuit comprises a frequency divider for dividing the oscillating frequency output signal 201 output from said oscillator to generate the pulse output signals 202.

In the present embodiment, there are four frequency dividers connected serially. The following frequency divider divides the output from the preceding frequency divider, to generate divide-by-two, divide-by-four, divide-by-eight, and divide-by-sixteen frequencies, respectively. The first frequency divider is separately combined with the outputs of the second, the third and the forth dividers via logical NAND gates to generate three pulse output signals 202a, 202b and 202c. In this embodiment, code number of the pulse output signals 202c, 202b and 202a is circled in the following sequence: 111, 111, 111, 111, 110, 111, 101, 111, 100, 111, 011, 111, 010, 111, 001, 111, 000. In specific applications, the code number of the pulse output signals is not limited by the above example.

Wherein, said delay circuit 103 is consisting of three charge and discharge regulating circuit, the second current source, the third current source, the third PMOS 317, the third NMOS 318, the second inverter 316 and the second hysteresis comparator 331. The oscillating frequency output signal 201 generated by said oscillating circuit 101 is connected to the gate of the third PMOS 317 and NMOS 318 after inverted by the second inverter 316; the third PMOS 317 is directly connected to VDD or connected to VDD via the first current source; the third NMOS 318 is directly connected to GND or connected to GND via the third current source; while at least one of the second or the third current sources must be existed. Each pulse signal of said decoding circuit 102 controls one charge and discharge regulating circuit for charging or discharging; each ramp pulse 406 of the charge and discharge regulating circuit is connected to the drain of the third PMOS 317 and the third NMOS 318, and the ramp pulse signals of each charge and discharge regulating circuit are superimposed and then transmitted to the second hysteresis comparator 331, to see if it reached the inverting voltage and generate the frequency jitter output signal 203.

Said charge and discharge regulating circuit comprises the fourth NMOS, the fifth NMOS, the second capacitor and the third inverter. The pulse output signal generated by said decoding circuit 102 is input to the gate of the fourth NMOS, and to the gate of the fifth NMOS via the inverter. The drain and gate of the fourth NMOS are connected to two ends of the capacitor; the source of the fourth NMOS is connected to GND; the source of the fifth NMOS is connected to the drain of the fourth NMOS and ramp pulses is output by the drain of the fifth NMOS. As status of pulse output signal 202 of the decoding circuit 102 keeps changing, the delay time of pulse edge generated by said delay circuit 103 changes, so that the edge frequency of the frequency jitter output signal 203 is changing. At the same time, the pulse output signal 202 generated by the decoding circuit 102 is a periodic pulse signal, thus after a certain cycle, the edge frequency generated by the frequency jitter output signal will be back to initial state when the cycle is completed.

Said hysteresis comparator 306 and 331 in the present invention can be composed of two comparators and RS trigger, or composed of Schmitt Trigger and inverter.

Figure 5:
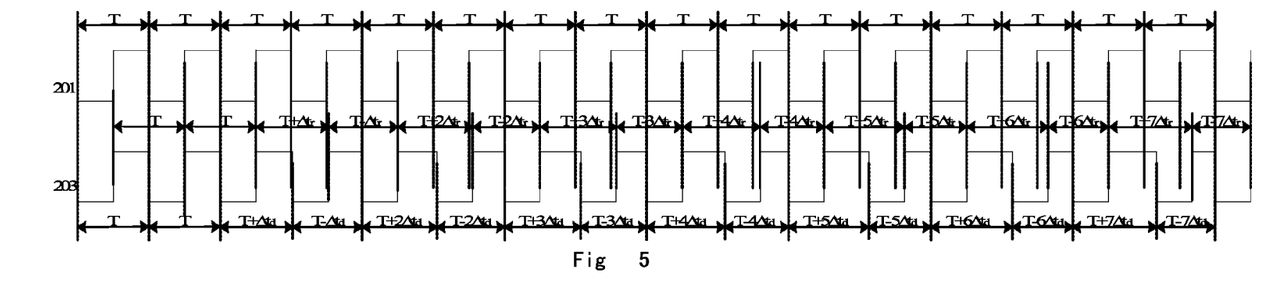
FIG. 5 is the waveform (I) of the frequency jitter circuit of the invention.

The slope of said ramp pulse 406 is determined by rising current $I_1$ or falling current $I_2$ and capacitance nC. Said rising current $I_1$ or falling current $I_2$ is generated by a mirror current source, i.e., $du/dt = I_1/nC$ and $du/dt = -I_2/nC$. Said capacitance nC is controlled by digital state of said divided pulse output signal 202a, 202b and 202c and determined by the capacitance of each charge and discharge regulating circuit. In the present embodiment, the capacitances of three second capacitors are C, 2C and 4C, respectively. The delay time is just the time length between the rising edge of oscillating frequency output signal 201 and the rising edge of said frequency jitter output signal 203, which is calculated by the following formula: $\Delta t_{rn} = nCV_1/I_1$. Given the minimum delay time $\Delta t_r = CV_1/I_1$, for example, the rising delay time order can be calculated as follows: 0, 0, $\Delta t_r$, 0, $2\Delta t_r$, 0, $3\Delta t$, 0, $4\Delta t_r$, 0, $5\Delta t_r$, 0, $6\Delta t_r$, 0, $7\Delta t_r$, 0, and the order of corresponding rising edge period is T, T, T+$\Delta t_r$, T−$\Delta t_r$, T+$2\Delta t_r$, T−$2\Delta t_r$, T+$3\Delta t_r$, T−$3\Delta t_r$, T+$4\Delta t_r$, T−$4\Delta t_r$, T+$5\Delta t_r$, T−$5\Delta t_r$, T+$6\Delta t_r$, T−$6\Delta t_r$, T+$7\Delta t_r$, T−$7\Delta t_r$, as shown in FIG. 5. In general, $\Delta t_r \ll T$, $f=1/T$, $$\Delta f_r = \frac{\Delta t_r}{T} f,$$

thus the changing order of corresponding rising edge frequency is f, f, f−$\Delta f_r$, f+$\Delta f_r$, f−$2\Delta f_r$, f+$2\Delta f_r$, f−$3\Delta f_r$, f+$3\Delta f_r$, f−$4\Delta f_r$, f+$4\Delta f_r$, f−$5\Delta f_r$, f+$5\Delta f_r$, f−$6\Delta f_r$, f+$6\Delta f_r$, f−$7\Delta f_r$, f+$7\Delta f_r$. In a similar way, when the ramp voltage of said ramp pulse 406 decreases to reference voltage $V_2$, the said frequency jitter output signal 203 is inverted by the hysteresis comparator 331. The delay time is just the time length between the falling edge of said oscillating frequency output signal 201 and the falling edge of said frequency jitter output signal 203, which is calculated by the following formula: $\Delta t_{dn} = nC(VDD-V_2)/I_2$. As an embodiment, the digital state of said pulse output 202c, 202b, 202a is circled in the following order: 001, 000, 010, 000, 011, 000, 100, 000, 101, 000, 110, 000, 111, 000, 000, 000. Given the minimum delay time $\Delta t_d = C(VDD-V_2)/I_2$, the falling delay time order can be calculated as follows: 0, 0, $\Delta t_d$, 0, $2\Delta t_d$, 0, $3\Delta t_d$, 0, $4\Delta t_d$, 0, $5\Delta t_d$, 0, $6\Delta t_d$, 0, $7\Delta t_d$, 0, and the order of corresponding falling edge cycle is T, T, T+$\Delta t_d$, T−$\Delta t_d$, T+$2\Delta t_d$, T−$2\Delta t_d$, T+$3\Delta t_d$, T−$3\Delta t_d$, T+$4\Delta t_d$, T−$4\Delta t_d$, T+$5\Delta t_d$, T−$5\Delta t_d$, T+$6\Delta t_d$, T−$6\Delta t_d$, T+$7\Delta t_d$, T−$7\Delta t_d$. In general, $\Delta t_d \ll T$, $f=1/T$, $$\Delta f_d = \frac{\Delta t_d}{T} f,$$

thus the changing order of corresponding rising edge frequency is f, f, f−$\Delta f_d$, f+$\Delta f_d$, f−$2\Delta f_d$, f+$2\Delta f_d$, f−$3\Delta f_d$, f+$3\Delta f_d$, f−$4\Delta f_d$, f+$4\Delta f_d$, f−$5\Delta f_d$, f+$5\Delta f_d$, f−$6\Delta f_d$, f+$6\Delta f_d$, f−$7\Delta f_d$, f+$7\Delta f_d$.

Figure 6:
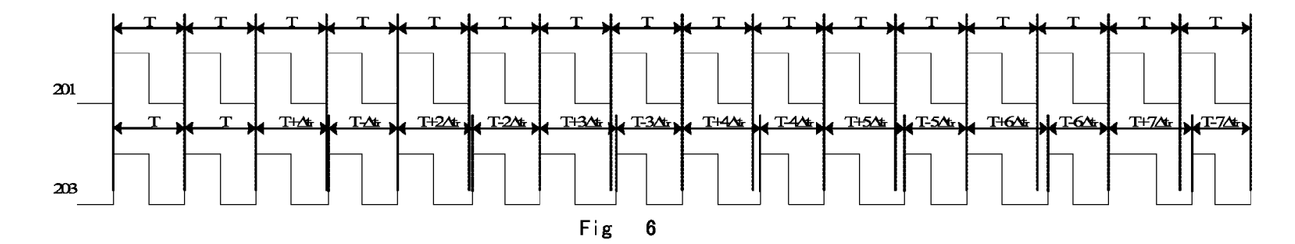
FIG. 6 is the waveform (II) of the frequency jitter circuit of the invention.
Figure 7:
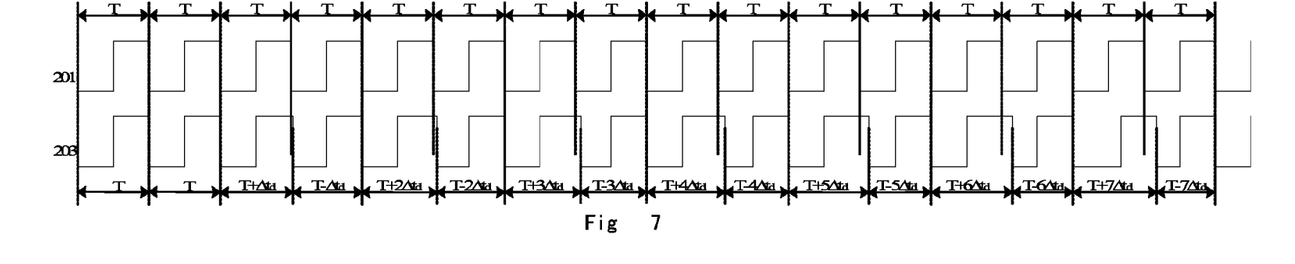
FIG. 7 is the waveform (III) of the frequency jitter circuit of the invention.

In above embodiment, the frequency changing order of rising edge and falling edge is the same, except that the minimum frequency change is different. In practice, the frequency changing order is not limited to the decimal counting. When the source of NMOS 318 is directly connected to ground, the waveform of frequency jitter output signal has only the rising delay time, as shown in FIG. 6; while, if the source of PMOS 317 is directly connected to VDD, the waveform of frequency jitter output signal has only the falling delay time, as shown in FIG. 7.

Figure 8:
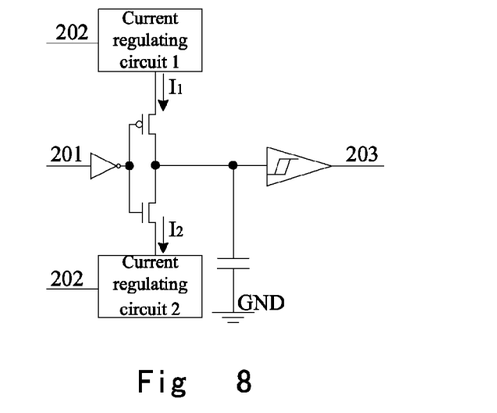
FIG. 8 is the block diagram (I) of time delay circuit of the invention.
Figure 9:
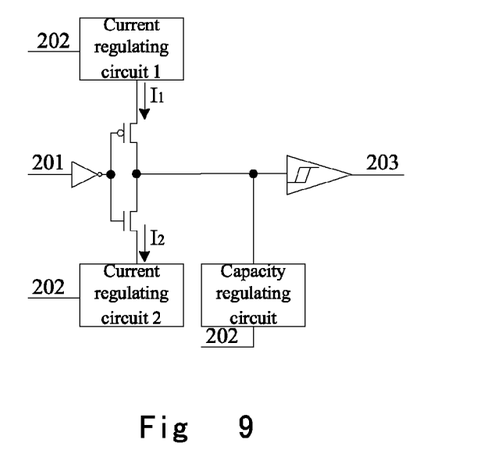
FIG. 9 is the block diagram (II) of time delay circuit of the invention.
Figure 10:
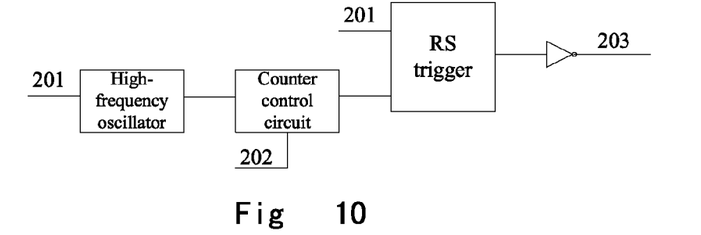
FIG. 10 is the block diagram (III) of time delay circuit of the invention.
Figure 11:
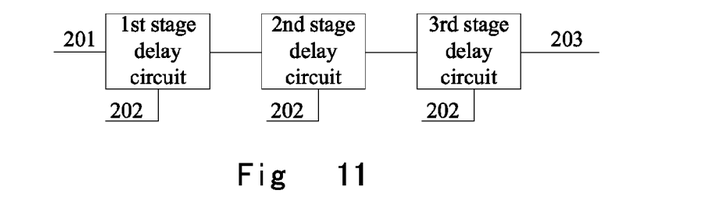
FIG. 11 is the block diagram (IV) of time delay circuit of the invention.

The delay time of said delay circuit 103 can be generated in other manners, such as controlling, by several pulse output signals, regulating current which charges/discharges a fixed capacitor, as shown in FIG. 8; or controlling, by several pulse output signals, the current and capacitance, as shown in FIG. 9; or controlling, by several pulse output signals, counting of high-frequency oscillator, as shown in FIG. 10; or controlling, by several pulse output signals, a multi-stage delay circuit, as shown in FIG. 11. In practice, there are more kinds of delay circuits implemented by prior art.

Figure 4:
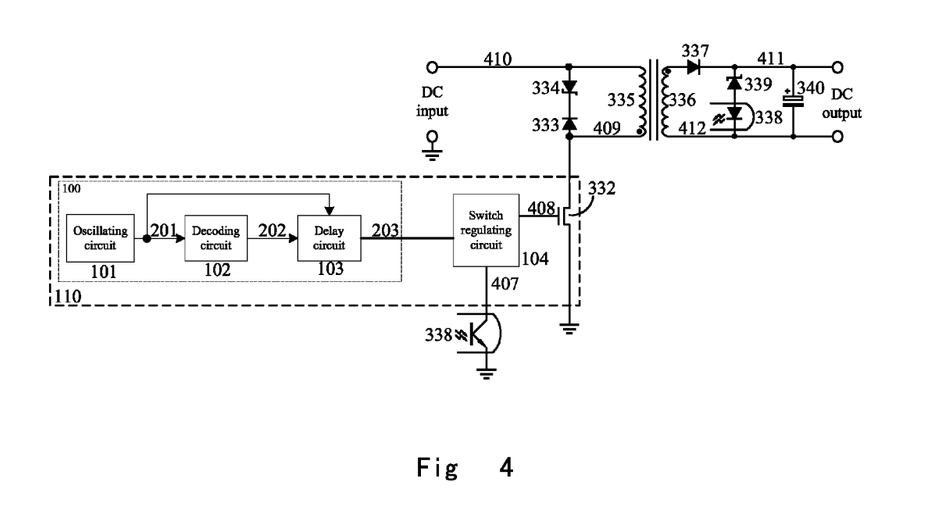
FIG. 4 is a SMPS embodiment implemented by using the frequency jitter circuit of the present invention.

FIG. 4 illustrates a frequency jitter circuit in SNIPS application. DC voltage input 410 is connected to the primary coil 335 of the transformer, and the two ends of the primary coil are connected to serially-connected the first zener diode 334 and the first diode 333. One end of the secondary coil 336 is connected to the second diode 337; output of the second diode 337 is connected to one end of the third capacitor 340, which is the positive DC voltage output 411 as well. The other end of said third capacitor 340 is the negative DC voltage output 412. The other end of secondary coil of said transformer is connected to the negative DC voltage output. One end of the second zener diode 339 is connected to the positive DC voltage output, while the other end is connected to one end of the input LED of photoelectric coupler 338; the other end of said LED is connected to the negative DC voltage output. The collector of the output transistor of said photoelectric coupler is connected to feedback signal 407, the voltage of which is regulated by the current of said collector; the voltage of said feedback signal controls the switch regulating circuit 104 to adjust the switch signal 408. The other end 409 of the primary coil of transformer is connected to the power switch, another end of the power switch is connected to ground, and the third end thereof is connected to the switch signal. The power switch is driven by said switch regulating circuit to adjust the DC voltage output. The frequency jitter output signal 203 controls the switch regulating circuit to generate switch frequency signal, and voltage of the feedback signal controls the switch regulating circuit to generate switch duty ratio signal. Said frequency jitter output signal is generated by the frequency jitter circuit which comprises:

an oscillating circuit 101, which generates oscillating frequency output signal 201;

a decoding circuit 102, which is controlled by said oscillating frequency output signal 201 to generate several pulse output signals 202, in the present embodiment, three pulse signals are generated for example;

a delay circuit 103, through which said oscillating frequency output signal 201 is transmitted to generate the frequency jitter output signal 203 which is delayed a period of time compared to said oscillating frequency output signal 201. Said pulse output signal 202 controls delay time of frequency jitter output signal.

A method of generating frequency jitters, comprising:
(1) generating oscillating frequency output signal;
(2) decoding the oscillating frequency output signal to generate several pulse output signals;

(3) delaying said oscillating frequency output signal to generate frequency jitter output signal and said pulse output signals controls the delay time of said frequency jitter output signal.

Step (1) comprising: said oscillating frequency output signal is fed back to the differential switch which controls the charging and discharging of the first capacitor. When the oscillating frequency output signal reaches first level, the first capacitor is charged by the first current source; when the ramp voltage of the first capacitor reaches the discharging reference voltage, the oscillating signal is inverted and the first capacitor is discharged; when the ramp voltage of the first capacitor reaches the charging reference voltage, the oscillating signal is inverted again to get a oscillating frequency signal with oscillating period T.

Step (2) comprising: said pulse output signals are generated by dividing the oscillating frequency output signal by frequency divider.

One or more said frequency dividers could be used. If a plurality of said frequency dividers are used, they are serially connected and the following frequency divider divides the output signal from the preceding frequency divider. Then, the outputs of the plurality of frequency dividers are combined by a logic circuit to generate several pulse output signals.

Wherein, said step (2) can also be implemented by a counter generating one or more pulse output signals.

Wherein, step (3) comprising: when oscillating output signal is the first level, the each second capacitor is superimposed, and pulse signal controls the discharging of corresponding second capacitor to generate the ramp voltage. When the ramp voltage reaches the discharge reference voltage, the frequency jitter output signal changes to the first level. Comparing to the oscillating frequency output signal, said first level is delayed a period of time which is determined by the quantity and capacity of the discharge capacitors; When oscillating frequency output signal is the second level, the each second capacitor is superimposed, and pulse output signal controls the charging of corresponding second capacitor to generate the ramp voltage. When the ramp voltage reaches the charge reference voltage, the frequency jitter output signal changes to the second level. Comparing to the oscillating frequency output signal, said second voltage level is delayed a period of time which is determined by the quantity and capacity of the discharge capacitors.

A method for regulating SMPS, comprising:
(1) generating oscillating frequency output signal;
(2) decoding the oscillating frequency output signal to generate several pulse output signals;
(3) delaying said oscillating frequency output signal to generate frequency jitter output signal, which delays a period of time compared with the oscillating frequency output signal, and said pulse output signals control the delay time of said frequency jitter output signal;
(4) controlling, by the frequency jitter output signal, the switch regulating circuit to adjust the output of power switch of transformer's primary coil.

Although the preferred embodiments of the invention have been disclosed for illustrative purpose only and no unnecessary limitations should be understood therefrom, those skilled in the art will appreciated that various modifications, additions and substitutions are possible, without departing from the scope and spirit of the invention as disclosed in the accompanying claim.

What is claimed is:
1. A frequency jitter circuit, comprising:
an oscillating circuit, configured to generate an oscillating frequency output signal;

a decoding circuit, configured to be controlled by said oscillating frequency output signal for generating several pulse output signals;

a delay circuit, through which said oscillating frequency output signal is passed for generating a frequency jitter output signal that is delayed a period of delay time compared to said oscillating frequency output signal, said pulse output signal controls the delay time of the frequency jitter output signal; and a frequency divider, configured to connect to oscillating frequency output signal output from the oscillating circuit, and to divide the oscillating frequency output signal to generate a pulse output signal.

2. The frequency jitter circuit of claim 1, wherein said oscillating circuit comprises a differential switch, a first capacitor, a first hysteresis comparator and a first current source; said differential switch is connected to said first current source; said first hysteresis comparator compares ramp voltage output from said first capacitor with charge/discharge reference voltage, and the first hysteresis comparator outputs oscillating frequency output signal according to comparison results; the oscillating frequency output signal is fed back to the differential switch that controls charging and discharging of said first capacitor.

3. The frequency jitter circuit of claim 2, wherein said differential switch comprises a first PMOS, a second. PMOS, a first NMOS, a second NMOS and a first inverter, source of said first PMOS and source of second PMOS are connected to the first current source; drain of the first PMOS is connected to drain of the first NMOS; drain of the second PMOS is connected to drain of the second NMOS; drain of the first NMOS is connected to gates of the first NMOS and the second NMOS; source of the first NMOS and source of second NMOS are connected to ground; drain and source of the second NMOS are connected to two ends of the first capacitor, respectively; input of the first hysteresis comparator is connected to the first capacitor; the first hysteresis comparator outputs oscillating frequency output signal that is fed back to the gate of the second PMOS and the oscillating frequency output signal is fed back to the gate of the first PMOS after inversion by the first inverter.

4. The frequency jitter circuit of claim 1, wherein if there are a plurality of said frequency dividers, these dividers are serially connected and following frequency divider divides output from preceding frequency divider, and outputs of the plurality of frequency dividers are combined by a logic circuit to generate several pulse output signals.

5. The frequency jitter circuit of claim 1, wherein if there is only one said frequency divider, the frequency divider generates a pulse output signal.

6. The frequency jitter circuit of claim 1, wherein said decoding circuit is a counter that outputs one or more pulse output signals.

7. The frequency jitter circuit of claim 1, wherein said delay circuit comprises charge and discharge regulating circuits, a second current source, a third current source, a third PMOS, a third NMOS, a second inverter and a second hysteresis comparator; the number of said charge and discharge regulating circuits is identical to number of the pulse output signals; the oscillating frequency output signal output by said oscillating circuit is connected to gates of the third PMOS and the third NMOS after inversion by the second inverter; the third PMOS is connected to VDD directly or via the first current source; the third NMOS is connected to GND directly or via the third current source; and at least one of the second current source or the third current source must exist; each pulse output of said decoding circuit controls one charge and discharge regulating circuit for charging or discharging individually; ramp pulse output of each charge and discharge regulating circuit is connected to drains of the third PMOS and the third NMOS, ramp pulses output from each charge and discharge regulating circuit are superimposed and then input to the second hysteresis comparator to see if it reaches an inverting voltage and to output the frequency jitter output signal.

8. The frequency jitter circuit of claim 7, wherein said charge and discharge regulating circuit comprises a fourth NMOS, a fifth NMOS, a second capacitor and a third inverter; the pulse output signal of said decoding circuit is input to gate of the fourth NMOS, and the pulse output signal is input to gate of the fifth NMOS via the inverter; the drain and source of the fourth NMOS are connected to two ends of the capacitor; source of the fourth NMOS is connected to GND; source of the fifth NMOS is connected to drain of the fourth NMOS, and ramp pulses are output by drain of the fifth NMOS.

9. The frequency jitter circuit of claim 1, wherein said delay circuit generates delay time in one of the four following manners:
(1) controlling, by several pulse output signals, regulating current to charge/discharge to a fixed capacitor;
(2) controlling, by several pulse output signals, regulating current and capacity;
(3) controlling, by several pulse output signals, counting of high-frequency oscillator;
(4) controlling, by several pulse output signals, a multi-stage delay circuit.

10. A method of generating frequency jitters, comprising:
(1) generating oscillating frequency output signal;
(2) decoding the oscillating frequency output signal to generate several pulse output signals;
(3) delaying said oscillating frequency output signal to generate frequency jitter output signal, the frequency jitter output signal is delayed a period of delay time compared with the oscillating frequency output signal, and said pulse output signals controls the delay time of said frequency jitter output signal;
wherein said pulse output signals are generated by dividing oscillating frequency output signal by a frequency divider.

11. The method of claim 10, wherein step (1) comprising:
said oscillating frequency output signal is fed back to differential switch that controls charging and discharging of a first capacitor; when the oscillating frequency output signal reaches a first level, the first capacitor is charged by a first current source; when ramp voltage of the first capacitor reaches a discharging reference voltage, the oscillating frequency output signal is inverted and the first capacitor discharges; when the ramp voltage of the first capacitor reaches a charging reference voltage, the oscillating frequency output signal is inverted again to get a oscillating frequency output signal with oscillating period T.

12. The method of claim 10, wherein there are a plurality of frequency dividers, which are serially connected and following frequency divider divides output from preceding frequency divider, and outputs of the plurality of frequency dividers are combined by a logic circuit to generate several pulse output signals.

13. The method of claim 10, wherein step (3) comprising:
when oscillating frequency output signal is in first level, the pulse output signal controls discharging of corresponding second capacitor, and when superimposed ramp voltage of each second capacitor controlled by the pulse output signal reaches the discharge reference voltage, the frequency jitter output signal is in first level; and compared to the oscillating frequency output signal, time of said first level is delayed a period of time, the delay time is determined by quantity and capacity of discharge capacitors; when oscillating frequency output signal is in second level, the pulse output signal controls charging of corresponding second capacitor, and when the superimposed ramp voltage of each second capacitor controlled by the pulse output signal reaches the charge reference voltage, the frequency jitter output signal is in second level; and compared to the oscillating frequency output signal, time of said second level is delayed a period of time, the delay time is determined by quantity and capacity of charge capacitors.

14. A switched-mode power supply, including:
a transformer, one terminal of primary coil of the transformer is connected to DC voltage input; one terminal of secondary coil of the transformer is connected to a diode, wherein, the other terminal of the diode is connected to positive end of DC voltage output; the other terminal of the secondary coil is connected to negative end of the DC voltage output;
a power switch, the first terminal of the power switch is connected to the other terminal of said transformer's primary coil; the second terminal is connected to ground, and the third terminal is connected to a switch regulating circuit;
a switch regulating circuit, a frequency jitter output signal and feedback signal of output of said transformer control the switch regulating circuit for switch signal regulation; said frequency jitter output signal regulates frequency of the switch signal, said feedback signal regulates duty ratio of switch signal;
a frequency jitter circuit comprising:
an oscillating circuit, configured to generate an oscillating frequency output signal;
a decoding circuit, configured to be controlled by said oscillating frequency output signal to generate several pulse output signals;
a delay circuit, through which said oscillating frequency output signal is passed to generate the frequency jitter output signal which is delayed a period of time compared to said oscillating frequency output signal; said pulse output signal controls delay time of frequency jitter output signal.

15. A method for regulating switched-mode power supply, comprising:
(1) generating oscillating frequency output signal;
(2) decoding the oscillating frequency output signal to generate several pulse output signals;
(3) delaying said oscillating frequency output signal to generate frequency jitter output signal and said frequency jitter output signal controls delay time of said frequency jitter output signal;
(4) controlling, by the frequency jitter output signal, the switch regulating circuit to adjust the output of power switch connected to transformer's primary coil.

* * * * *